US012757640B2

(12) United States Patent
Jeong et al.

(10) Patent No.: US 12,757,640 B2
(45) Date of Patent: Oct. 6, 2026

(54) NITRIDE SEED LAYER WITH HIGH THERMAL STABILITY FOR GROWTH OF PERPENDICULARLY MAGNETIZED HEUSLER FILMS

(71) Applicants: Samsung Electronics Co., Ltd., Suwon-si (KR); International Business Machines Corporation, Armonk, NY (US)

(72) Inventors: Jaewoo Jeong, San Jose, CA (US); Ikhtiar, San Jose, CA (US); Panagiotis Charilaos Filippou, Fremont, CA (US); Chirag Garg, San Jose, CA (US); See-Hun Yang, Morgan Hill, CA (US); Mahesh Samant, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 490 days.

(21) Appl. No.: 18/218,920

(22) Filed: Jul. 6, 2023

(65) Prior Publication Data

US 2024/0349619 A1 Oct. 17, 2024

(30) Foreign Application Priority Data

Apr. 12, 2023 (GR) .............................. 20230100325

(51) Int. Cl.

| | |
|---|---|
| ***H10N 50/80*** | (2023.01) |
| ***H01F 10/32*** | (2006.01) |
| ***H10B 61/00*** | (2023.01) |
| ***H10N 50/01*** | (2023.01) |
| ***H10N 50/20*** | (2023.01) |
| ***H10N 50/85*** | (2023.01) |

(52) U.S. Cl.

CPC ......... *H10N 50/80* (2023.02); *H01F 10/3254* (2013.01); *H01F 10/3272* (2013.01); *H10B 61/00* (2023.02); *H10N 50/01* (2023.02); *H10N 50/20* (2023.02); *H10N 50/85* (2023.02)

(58) Field of Classification Search

CPC ........ H10N 50/80; H10N 50/20; H10N 50/01; H10N 50/85; H01F 10/3254; H01F 10/3272; H10B 61/00

USPC .......................................................... 257/421

See application file for complete search history.

(56) References Cited

U.S. PATENT DOCUMENTS

| | | | | |
|---|---|---|---|---|
| 8,679,942 | B2 | 3/2014 | Letertre et al. | |
| 9,406,365 | B1 | 8/2016 | Jeong et al. | |
| 9,831,420 | B2 | 11/2017 | Kitagawa et al. | |
| 10,170,696 | B1 * | 1/2019 | Jeong | G11C 11/161 |
| 10,388,777 | B2 | 8/2019 | Dasgupta et al. | |
| 10,622,406 | B2 | 4/2020 | Reznicek et al. | |

(Continued)

FOREIGN PATENT DOCUMENTS

CN 111599915 A 8/2020

*Primary Examiner* — Jami Valentine Miller

(74) *Attorney, Agent, or Firm* — Womble Bond Dickinson (US) LLP

(57) ABSTRACT

A magnetic memory device includes a substrate, a thermally stable nitride seed layer substantially oriented in a (001) direction above the substrate, a chemical templating layer above the thermally stable nitride seed layer, and a magnetic layer above the chemical templating layer. The chemical templating layer includes a binary alloy having a CsCl prototype structure, and the magnetic layer includes a Heusler compound having perpendicular magnetic anisotropy (PMA).

22 Claims, 3 Drawing Sheets

(56) References Cited

U.S. PATENT DOCUMENTS

| | | | | |
|---|---|---|---|---|
| 10,651,234 | B2 * | 5/2020 | Jeong | G11C 11/161 |
| 11,005,029 | B2 * | 5/2021 | Jeong | G11C 11/16 |
| 2005/0016642 | A1 * | 1/2005 | Oikawa | C22F 1/10 148/563 |
| 2005/0274439 | A1 * | 12/2005 | Gschneidner | C01B 3/0047 420/416 |
| 2015/0162378 | A1 * | 6/2015 | Carey | H10N 50/10 257/421 |
| 2019/0305040 | A1 * | 10/2019 | Jeong | H10B 61/00 |
| 2020/0105999 | A1 * | 4/2020 | Jeong | H10N 50/01 |
| 2021/0391470 | A1 | 12/2021 | Manfrini et al. | |
| 2021/0391471 | A1 | 12/2021 | Vellianitis et al. | |
| 2022/0077233 | A1 | 3/2022 | Incorvia et al. | |
| 2022/0223783 | A1 * | 7/2022 | Jeong | H10B 61/00 |
| 2023/0273240 | A1 * | 8/2023 | Fecher | C22C 9/00 |
| 2023/0317129 | A1 * | 10/2023 | Faleev | H10N 50/85 365/158 |
| 2023/0320231 | A1 * | 10/2023 | Faleev | H01F 10/1936 257/421 |
| 2023/0413681 | A1 * | 12/2023 | Filippou | G11C 11/161 |
| 2024/0155950 | A1 * | 5/2024 | Filippou | H10N 50/10 |
| 2024/0244982 | A1 * | 7/2024 | Hu | H10N 50/10 |
| 2024/0306517 | A1 * | 9/2024 | Garg | H01F 10/30 |
| 2026/0009117 | A1 * | 1/2026 | Chen | C23C 14/0036 |

* cited by examiner

NITRIDE SEED LAYER WITH HIGH THERMAL STABILITY FOR GROWTH OF PERPENDICULARLY MAGNETIZED HEUSLER FILMS

CROSS-REFERENCE TO RELATED APPLICATION

This application claims priority to and the benefit of Greek patent application Ser. No. 20230100325, filed on Apr. 12, 2023, the entire content of which is hereby incorporated by reference.

BACKGROUND

1. Field

The present disclosure relates to magnetic memory devices and to thermally stable nitride seed layers and chemical templating layers for the growth of perpendicularly magnetized Heusler films.

2. Description of the Related Art

Magnetic random-access memory (MRAM) devices store information utilizing magnetic materials as an information recording medium. One type of MRAM is a spin-transfer-torque magnetic random-access memory (STT-MRAM). STT-MRAM devices include a magnetic tunnel junction (MTJ) having a tunnel barrier layer stacked between a magnetic free layer and a magnetic pinned (or fixed) layer. To write to a STT-MRAM device, current is driven through the MTJ, which causes the magnetic moment of the free layer to be either aligned or anti-aligned with the magnetic moment of the pinned layer using spin transfer torque (STT). To read from the STT-MRAM, a read current passes through the MTJ.

In some related art STT-MRAM devices, one of the magnetic layers includes a Heusler compound, which has a large perpendicular magnetic anisotropy (PMA) and a low moment due to a ferrimagnetic configuration that are suitable for STT-MRAM applications. These STT-MRAM devices may include a ferromagnetic Heusler compound where the moment depends on the constituent elements. Additionally, related art STT-MRAM devices may include a CoAl chemical templating layer that promotes the ordered growth of the Heusler compound at an ultrathin thickness and at room temperature. The chemical templating layer needs to have a (001) orientation (these chemical templating layers have body-centered cubic (BCC) structure so (001) orientation is equivalent to (100) or (010) orientations), and thus related art STT-MRAM devices may include a seed layer below the chemical templating layer to promote such ordered growth of the chemical templating layer.

The above information disclosed in this Background section is only for enhancement of understanding of the background of the invention and therefore it may contain information that does not constitute prior art.

SUMMARY

The present disclosure relates to various embodiments of a magnetic memory device, such as a spin-transfer-torque magnetic random-access memory (STT-MRAM) device. In one embodiment, the magnetic memory device includes a substrate, a thermally stable nitride seed layer substantially oriented in a (001) direction above the substrate, a chemical templating layer above the thermally stable nitride seed layer, and a magnetic layer above the chemical templating layer. The magnetic layer includes a Heusler compound having a magnetization direction substantially perpendicular to the magnetic layer, and the chemical templating layer includes a binary alloy having a CsCl prototype structure.

The present disclosure also relates to various embodiments of a method of manufacturing a magnetic memory device. In one embodiment, the method includes growing a thermally stable nitride seed layer substantially oriented in a (001) direction above a substrate, growing a chemical templating layer above the thermally stable nitride seed layer, forming a magnetic tunnel junction above the chemical templating layer, and annealing the magnetic tunnel junction. Forming the magnetic tunnel junction includes forming a first magnetic layer including a Heusler compound having perpendicular magnetic anisotropy above the chemical templating layer, forming a tunnel barrier layer above the first magnetic layer, and forming a second magnetic layer above the tunnel barrier. The chemical templating layer includes a binary alloy having a CsCl prototype structure. The negative formation energy of the thermally stable nitride seed layer mitigates against interdiffusion of the thermally stable nitride seed layer into the chemical templating layer or any other seed layer located between the nitride layer and the chemical templating layer during the annealing of the magnetic tunnel junction.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1:
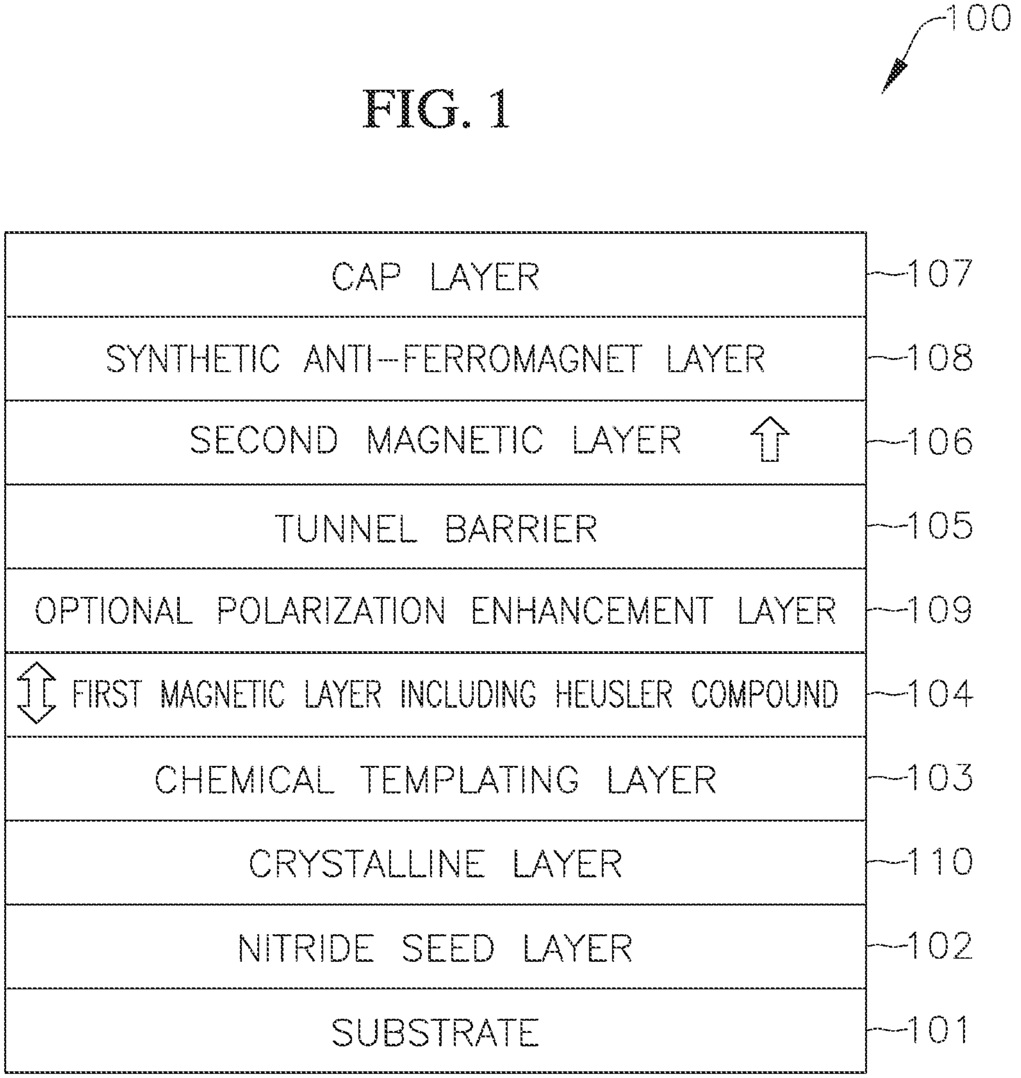
FIG. 1 is a cross-sectional view of a magnetic memory device according to one embodiment of the present disclosure including a magnetic layer with a Heusler compound, a chemical templating layer, and a thermally stable nitride seed layer.

The present disclosure relates to various embodiments of a magnetic memory device, such as a spin-transfer torque magnetoresistive random-access memory (STT-MRAM) device, having a Heusler compound layer. Heusler compounds have perpendicular magnetic anisotropy (PMA) and low moment either due to their ferrimagnetic configuration or due to appropriate selection of elements comprising ferromagnetic configuration, which make them suitable for STT-MRAM devices. These properties enable fast switching (e.g., less than approximately 20 nanoseconds) of the STT-MRAM device with relatively lower switching current compared to in-plane magnetized magnetic tunnel junctions (MTJs) or higher moment materials, such as CoFe alloys, which have the same thermal energy barrier.

The magnetic memory devices of the present disclosure also include a chemical templating layer for forming (growing) the Heusler compound, and a seed layer for growing the chemical templating layer with a (001) orientation. In one or more embodiments, the chemical templating layer includes CoAl and the seed layer includes a thermally stable nitride having a relatively low negative formation energy, which results in relatively low interdiffusion between the seed layer and the chemical templating layer during a high temperature annealing process utilized to form the STT-MRAM device. Otherwise, interdiffusion between the seed layer and the chemical templating layer would result in deterioration of the PMA of the Heusler compound in the first magnetic layer.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as “beneath,” “below,” “lower,” “under,” “above,” “upper,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below” or “beneath” or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly.

It will be understood that, although the terms “first,” “second,” “third,” etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being “on,” “connected to,” or “coupled to” another element or layer, it can be directly on, connected to, or coupled to the other element or layer, or one or more intervening elements or layers may be present. In addition, it will also be understood that when an element or layer is referred to as being “between” two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms “a” and “an” are intended to include the plural forms as well, unless the context clearly indicates otherwise. It will be further understood that the terms “comprises,” “comprising,” “includes,” and “including,” when used in this specification, specify the presence of the stated features, integers, steps, operations, elements, and/or components, but do not preclude the presence or addition of one or more other features, integers, steps, operations, elements, components, and/or groups thereof. As used herein, the term “and/or” includes any and all combinations of one or more of the associated listed items. Expressions such as “at least one of,” when preceding a list of elements, modify the entire list of elements and do not modify the individual elements of the list.

As used herein, the term “substantially,” “about,” and similar terms are used as terms of approximation and not as terms of degree, and are intended to account for the inherent variations in measured or calculated values that would be recognized by those of ordinary skill in the art. Further, the use of “may” when describing embodiments of the present invention refers to “one or more embodiments of the present invention.” As used herein, the terms “use,” “using,” and “used” may be considered synonymous with the terms “utilize,” “utilizing,” and “utilized,” respectively. Also, the term “exemplary” is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The example embodiments are described in the context of particular magnetic junctions and magnetic memories having certain components. One of ordinary skill in the art will readily recognize that embodiments of the present invention are consistent with the use of magnetic junctions and magnetic memories having other and/or additional components and/or other features not inconsistent with embodiments of the present invention. The method and system are also described in the context of current understanding of spin-orbit interaction, the spin transfer phenomenon, of magnetic anisotropy, and other physical phenomena. Consequently, one of ordinary skill in the art will readily recognize that theoretical explanations of the behavior of the method and system are made based upon this current understanding of spin-orbit interaction, spin transfer, magnetic anisotropy and other physical phenomenon. However, the methods and systems described herein are not dependent upon a particular physical explanation. One of ordinary skill in the art will also readily recognize that the methods and systems are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions, spin-orbit interaction active layers, and/or other structures having particular layers. However, one of ordinary skill in the art will readily recognize that magnetic junctions, spin-orbit interaction active layers, and/or other structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

With reference now to FIG. 1, a magnetic memory device 100 according to one embodiment of the present disclosure includes a substrate 101, a thermally stable nitride seed layer 102 above the substrate 101, a chemical templating layer 103 above the thermally stable nitride seed layer 102, a first magnetic layer 104 comprising a Heusler compound above the chemical templating layer 103, a tunnel barrier layer 105 above the first magnetic layer 104, a second magnetic layer 106 above the tunnel barrier layer 105, and a cap layer 107 above the second magnetic layer 106. In one or more embodiments, the second magnetic layer 106 may include a Heusler compound. As described in more detail below, thermally stable nitride seed layer 102 is configured to enable growth of the chemical templating layer 103 with a (001) orientation, and the chemical templating layer 103 is configured to enable growth of the ordered Heusler compound at ultrathin thickness and at room temperature. The term "Heusler compound" refers to a magnetic intermetallic with a face-centered cubic crystal structure and a composition of XYZ (for half-Heuslers) or $X_2YZ$ (for full-Heuslers), where X and Y are transition metals and Z is in the p-block of the periodic table (i.e., elements in groups 13 to 18).

Together, the first magnetic layer 104 including the Heusler compound, the tunnel barrier layer 105, and the second magnetic layer 106 define a magnetic tunnel junction (MTJ). Additionally, in the illustrated embodiment, the second magnetic layer 106 has a fixed (or pinned) magnetization direction that is perpendicular to a surface of the second magnetic layer 106 (i.e., perpendicular to the tunnel barrier layer 105), and the magnetization direction (or state) of the first magnetic layer 104 having the Heusler compound is substantially perpendicular to the surface of the first magnetic layer 104 (i.e., perpendicular to the tunnel barrier layer 105) and is configured to switch to be either aligned or anti-aligned with the magnetization direction of the second magnetic layer 106 using spin transfer torque (STT). In this manner, the MTJ is a bi-stable system in which the second magnetic layer 106 functions as a reference layer and the first magnetic layer 104 including the Heusler compound functions as the bit storage layer.

In one or more embodiments, the magnetic memory device 100 may include a synthetic antiferromagnetic (SAF) layer 108 above the second magnetic layer 106. In one or more embodiments, the magnetic memory device 100 may include a tantalum (Ta) or Iridium (Ir) layer between the second magnetic layer 106 and the SAF layer 108. Additionally, in one or more embodiments, the magnetic memory device 100 may include a polarization enhancement layer 109 above the first magnetic layer 104 (i.e., between the first magnetic layer 104 and the tunnel barrier layer 105). In one or more embodiments, the magnetic memory device 100 may not include the SAF layer 108 and/or the polarization enhancement layer 109. Furthermore, in one or more embodiments, the magnetic memory device 100 may optionally include an optional crystalline layer 110 above the nitride seed layer 102 (i.e., between the nitride seed layer 102 and the chemical templating layer 103). In one or more embodiments, the optional crystalline layer 110 may include chromium (Cr) or a bilayer of chromium and iridium-aluminum (Cr/IrAl). In one or more embodiments, the magnetic memory device 100 may not include the optional crystalline layer 110.

In one or more embodiments, the tunnel barrier layer 105 comprises MgO. In one or more embodiments, the tunnel barrier layer 105 may be $MgAl_2O_4$ and the lattice spacing of the tunnel barrier layer 105 can be tuned (engineered) by controlling the Mg—Al composition to result in better lattice matching with the Heusler compound of the first magnetic layer 104. For example, in one or more embodiments, the tunnel barrier layer 105 can be represented as $Mg_{1-z}Al_{2+(2/3)z}O_4$ in which z is between −0.5 and 0.5.

In one or more embodiments, the composition of the thermally stable nitride seed layer 102 has a relatively low negative formation energy, which results in thermal stability at high annealing temperatures and thereby relatively low interdiffusion between the thermally stable nitride seed layer 102 and the chemical templating layer 103 during a high temperature annealing process utilized to form the magnetic memory device 100 (e.g., STT-MRAM). In one or more embodiments, the composition of the thermally stable nitride seed layer 102 may include ScN, TiN, AlN, VN, CrN, NbN, TaN, HfN, or ZrN. Additionally, in one or more embodiments, the thermally stable nitride seed layer 102 is oriented (or substantially oriented) in the direction. The term "[001] direction" refers to Miller indices of the composition. In one or more embodiments, the thermally stable nitride seed layer 102 may include a first layer and a second layer stacked above (e.g., on) the first layer. The first and second layers of the thermally stable nitride seed layer 102 may be different materials selected from ScN, TiN, AlN, VN, CrN, NbN, TaN, HfN, and ZrN.

The terms "formation energy" or "formation energies" refer to the energy which the system gains by forming the new material compared to the atoms being in their elemental phases. In general, the more negative the formation energy of the nitride, the more stable the thermally stable nitride seed layer 102 is, and thus the less prone the thermally stable nitride seed layer 102 is to interdiffusion into adjacent layers, such as the overlying chemical templating layer 103. Each of ScN, TiN, AlN, VN, CrN, NbN, TaN, HfN, and ZrN has a negative formation energy greater than −0.5 eV/atom. For instance, CrN has a formation energy of −0.75, VN has a formation energy of approximately −1.2, and TiN has a formation energy of approximately −1.8.

The thickness of the thermally stable nitride seed layer 102 may be optionally thinned down significantly without compromising the orientation. For instance, in one or more embodiments, the thermally stable nitride seed layer 102 may have a thickness in a range from approximately 10 Å to approximately 300 Å. In one or more embodiments, the thickness of the nitride seed layer 102 may be the minimum thickness required to form crystalline phase and (001) orientation, which is unique for each nitride material.

In one or more embodiments, the chemical templating layer 103 includes a binary compound having a CsCl prototype structure. As used herein, the term "CsCl prototype structure" refers to a crystal structure having a Strukturbericht designation of B2, a Pearson symbol of cP20, a simple cubic Bravais Lattice, a space group of Pm $\bar{3}$m, and a space group number of 221. In one or more embodiments, the binary alloy having the CsCl prototype structure may be CoAl oriented (or substantially oriented) in the [001] direction (i.e., Miller indices [001]) and include an alternating layered structure of cobalt (Co) atoms and aluminum (Al) atoms. In one or more embodiments, the binary alloy with the CsCl prototype structure is represented by $A_{1-x}E_x$, in which A is a transition metal element, E is main group element, and x is in a range from 0.45 to 0.55. For example, in one or more embodiments, A is cobalt (Co) and E is aluminum (Al).

The Heusler compound of the first magnetic layer 104 has perpendicular magnetic anisotropy (PMA), low moment due to ferrimagnetic configuration, and large anisotropy. In one or more embodiments, the Heusler compound of the first magnetic layer 104 includes a plurality of layers alternating between a layer including only a transition metal element, and another layer including a main group element and a transition metal element. For instance, in one or more embodiments, the Heusler compound includes a plurality of layers alternating between a layer of Mn—Mn atoms and a layer of Mn—Ge atoms. In one or more embodiments, the Heusler compound in the first magnetic layer 104 may be $Mn_3Z$, where Z is germanium (Ge), tin (Sn), or antimony (Sb), each of which has perpendicular magnetic anisotropy (PMA), low moment due to ferrimagnetic configuration, and large anisotropy. In one or more embodiments, the Heusler compound may be a tetragonal Heusler compound, such as $Mn_3Z$ in which Z is Ge, Sn, or Sb. For example, in one or more embodiments, the tetragonal Heusler compound may be $Mn_{3.3-x}Ge$, $Mn_{3.3-x}Sn$, or $Mn_{3.3-x}Sb$ in which x is in a range from 0 to 1.1. In one or more embodiments, the Heusler compound may be a ternary Heusler compound (e.g., $Mn_{3.3-x}Co_{1.1-y}Sn$, in which x≤1.2 and y≤1.0). In one or more embodiments, the Heusler compound may be $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, or $Co_2MnSi$.

Figure 2:
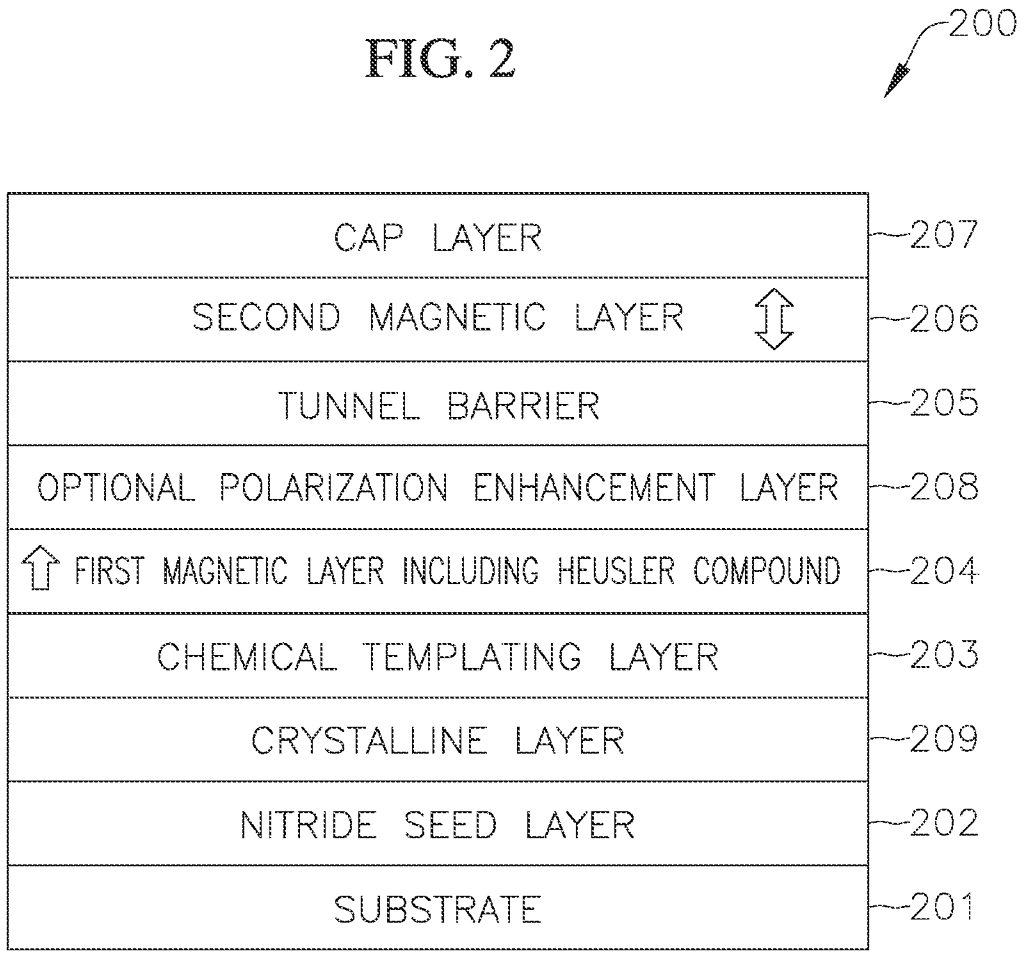
FIG. 2 is a cross-sectional view of a magnetic memory device according to another embodiment of the present disclosure including a magnetic layer with a Heusler compound, a chemical templating layer, and a thermally stable nitride seed layer.

With reference now to FIG. 2, a magnetic memory device 200 (e.g., a STT-MRAM device) according to another embodiment of the present disclosure includes a substrate 201, a thermally stable nitride seed layer 202 above the substrate 201, a chemical templating layer 203 above the thermally stable nitride seed layer 202, a first magnetic layer 204 comprising a Heusler compound above the chemical templating layer 203, a tunnel barrier layer 205 above the first magnetic layer 204, a second magnetic layer 206 above the tunnel barrier layer 205, and a cap layer 207 above the second magnetic layer 206. In one or more embodiments, the second magnetic layer 206 may include a Heusler compound. Additionally, in the illustrated embodiment, the magnetic memory device 200 includes a polarization enhancement layer 208 above the first magnetic layer 204 and, optionally, an optional crystalline layer 209 above the thermally stable nitride seed layer 202, although in one or more embodiments the magnetic memory device 200 may not include the polarization enhancement layer 208 and/or the optional crystalline layer 209. In one or more embodiments, the optional crystalline layer 209 may include chromium (Cr) or a bilayer of chromium and iridium-aluminum (Cr/IrAl). In one or more embodiments, the thermally stable nitride seed layer 202, the chemical templating layer 203, the Heusler compound of the first magnetic layer 204, the tunnel barrier layer 205, the second magnetic layer 206, and the cap layer 207 may be the same as the thermally stable nitride seed layer 102, the chemical templating layer 103, the Heusler compound of the first magnetic layer 104, the tunnel barrier layer 105, the second magnetic layer 106, and the cap layer 107, respectively, as described above with reference to the embodiment of the magnetic memory device 100 illustrated in FIG. 1.

Together, the first magnetic layer 204 including the Heusler compound, the tunnel barrier layer 205, and the second magnetic layer 206 define a magnetic tunnel junction (MTJ). Additionally, in the illustrated embodiment, the first magnetic layer 204 including the Heusler compound has a fixed (or pinned) magnetization direction that is perpendicular to the tunnel barrier layer 205, and the magnetization direction (or state) of the second magnetic layer 206 is configured to switch to be either aligned or anti-aligned with the magnetization direction of the first magnetic layer 204 using spin transfer torque (STT). In this manner, the MTJ is a bi-stable system in which the first magnetic layer 204 functions as a reference layer and the second magnetic layer 206 functions as the bit storage layer.

Figure 3:
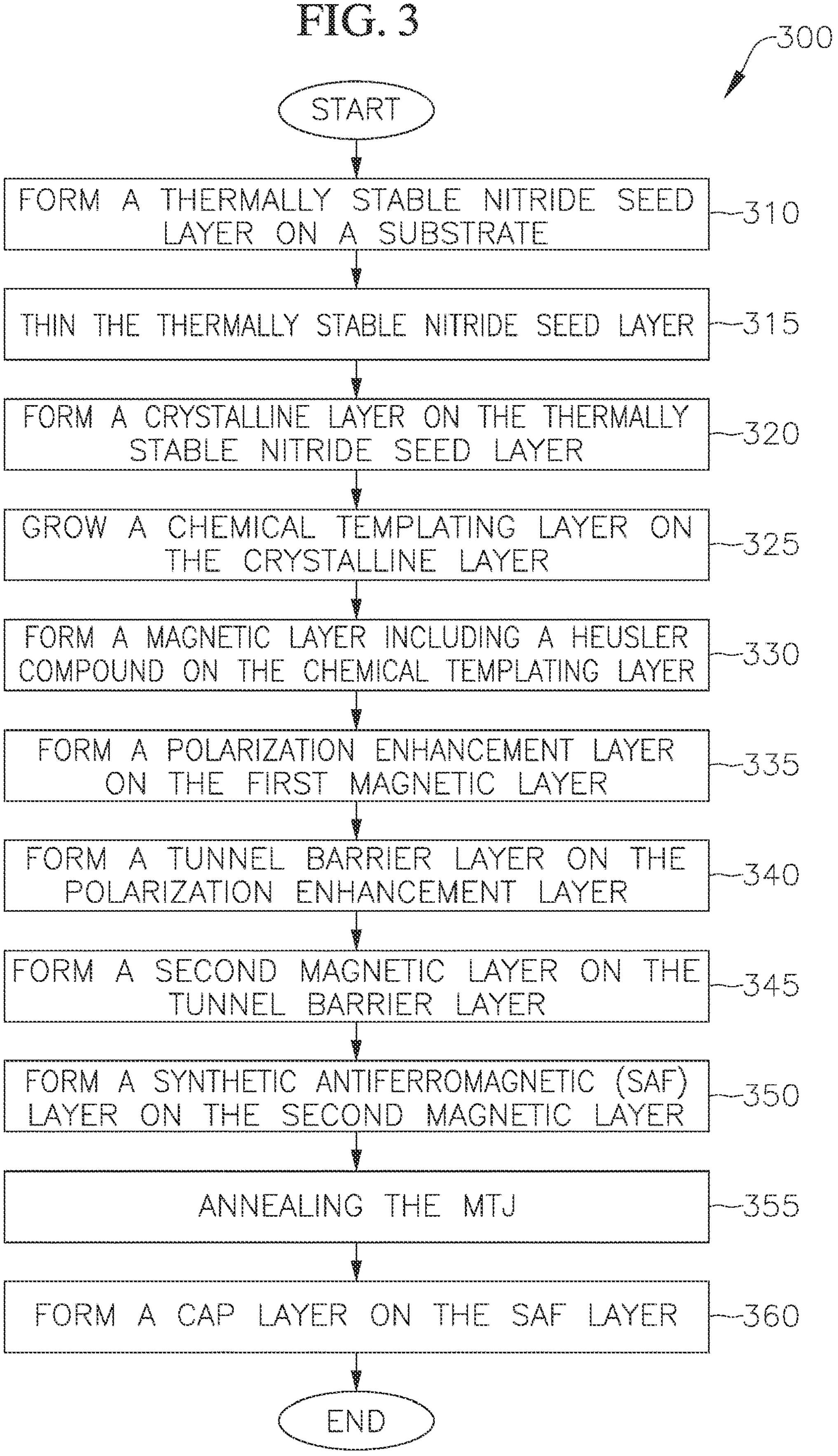
FIG. 3 is a flowchart illustrating tasks of a method of manufacturing a magnetic memory device according to one embodiment of the present disclosure.

FIG. 3 is a flowchart illustrating tasks of a method 300 of forming a magnetic memory device (e.g., an STT-MRAM device) according to one embodiment of the present disclosure.

In the illustrated embodiment, the method 300 includes a task 310 of forming (e.g., depositing) a thermally stable nitride seed layer above (e.g., on) a substrate such that the thermally stable nitride seed layer has a (001) orientation (or substantially a (001) orientation). For instance, in one or more embodiments, the composition of the thermally stable nitride seed layer formed in task 310 may include ScN, TiN, AlN, VN, CrN, NbN, TaN, HfN, or ZrN. Additionally, in one or more embodiments, the task 310 may include forming a first layer and a second layer stacked above (e.g., on) the first layer in which the first and second layers of the thermally stable nitride seed layer are different materials selected from ScN, TiN, AlN, VN, CrN, NbN, TaN, HfN, and ZrN.

In the illustrated embodiment, the method 300 also includes an optional task 315 of thinning the thermally stable nitride seed layer formed in task 310 such that the thermally stable nitride seed layer has a thickness in a range from approximately 5 Å to approximately 300 Å. In one or more embodiments, the task 310 may include depositing a sufficiently thin nitride layer such that the optional task 315 of thinning the nitride seed layer is not performed. In one or more embodiments, the task 315 of thinning the thermally stable nitride seed layer may include etching (e.g., wet etching or dry etching, such as ion milling, chemically assisted ion beam etching (CAIBE), reactive ion beam etching (RIBE), reactive ion etching (RIE), electron-cyclotron resonance reactive ion etching (ECR-RIE), or inductively-coupled-plasma reactive ion etching (ICP-RIE)) the thermally stable nitride seed layer.

In the illustrated embodiment, the method 300 also includes an optional task 320 of forming (e.g., depositing) an optional crystalline layer above the thermally stable nitride seed layer formed in task 310. In one or more embodiments, the optional crystalline layer may include chromium (Cr) or a bilayer of chromium and iridium-aluminum (Cr/IrAl). In one or more embodiments, the method 300 may not include the task 320 of forming the optional crystalline layer.

In the illustrated embodiment, the method 300 also includes a task 325 of growing a chemical templating layer above (e.g., on) the crystalline layer formed in task 320 or, if the task 320 is not performed, above (e.g., on) the thermally stable nitride seed layer formed in task 315 or if optional task 315 is not performed then on nitride seed layer formed in task 310. The thermally stable nitride seed layer formed in task 310 or in optional task 315 is configured to ensure that the chemical templating layer formed in task 325 is a binary compound having a CsCl prototype structure, such as CoAl (e.g., an alternating layered structure of cobalt (Co) atoms and aluminum (Al) atoms), and is oriented (or substantially oriented) in the direction. In one or more embodiments, the binary alloy with the CsCl prototype structure is represented by $A_{1-x}E_x$, in which A is a transition meatal element, E is main group element, and x is in a range from 0.45 to 0.55. For example, in one or more embodiments, A is cobalt (Co) and E is aluminum (Al).

In the illustrated embodiment, the method 300 also includes a task 330 of forming a magnetic layer including a Heusler compound above (e.g., on) the chemical templating layer formed in task 325. During task 330, the chemical templating layer is configured to provide the Heusler compound with perpendicular magnetic anisotropy (PMA). In one or more embodiments, the Heusler compound of the first magnetic layer includes a plurality of layers alternating between a layer including only a transition metal element, and another layer including a main group element and a transition metal element. For instance, in one or more embodiments, the Heusler compound includes a plurality of layers alternating between a layer of Mn—Mn atoms and a layer of Mn—Ge atoms. In one or more embodiments, the Heusler compound in the first magnetic layer may be $Mn_3Z$, where Z is germanium (Ge), tin (Sn), or antimony (Sb). In one or more embodiments, the Heusler compound may be a tetragonal Heusler compound, such as $Mn_3Z$ in which Z is Ge, Sn, or Sb. For example, in one or more embodiments, the tetragonal Heusler compound may be $Mn_{3.3-x}Ge$, $Mn_{3.3-x}Sn$, or $Mn_{3.3-x}Sb$ in which x is in a range from 0 to 1.1. In one or more embodiments, the Heusler compound may be a ternary Heusler compound (e.g., $Mn_{3.3-x}Co_{1.1-y}Sn$, in which $x \leq 1.2$ and $y \leq 1.0$).

In the illustrated embodiment, the method 300 also includes an optional task 335 of forming a polarization enhancement layer above (e.g., on) the first magnetic layer formed in task 330. In one or more embodiments, the method 300 may not include the task 335 of forming the polarization enhancement layer.

In the illustrated embodiment, the method 300 also includes a task 340 of forming a tunnel barrier layer above (e.g., on) the polarization enhancement layer formed in task 335 or, if task 335 is not performed, above (e.g., on) the magnetic layer formed in task 330. In one or more embodiments, the tunnel barrier layer may include MgO. In one or more embodiments, the tunnel barrier layer may be $MgAl_2O_4$ and the lattice spacing of the tunnel barrier layer can be tuned (engineered) by controlling the Mg—Al composition to result in better lattice matching with the Heusler compound of the first magnetic layer formed in task 330. For example, in one or more embodiments, the tunnel barrier layer can be represented as $Mg_{1-z}Al_{2+(2/3)z}O_4$ in which z is between −0.5 and 0.5.

In the illustrated embodiment, the method 300 also includes a task 345 of forming a second magnetic layer above (e.g., on) the tunnel barrier layer formed in task 340.

Together, the first magnetic layer including the Heusler compound formed in task 330, the tunnel barrier layer formed in task 340, and the second magnetic layer formed in task 345 define a magnetic tunnel junction (MTJ). In one or more embodiments, the second magnetic layer may have a fixed (or pinned) magnetization direction and the magnetization direction (or state) of the first magnetic layer having the Heusler compound may be configured to switch to be either aligned or anti-aligned with the magnetization direction of the second magnetic layer using spin transfer torque (STT). In this case, the MTJ is a bi-stable system in which the second magnetic layer functions as a reference layer and the first magnetic layer including the Heusler compound functions as the bit storage layer. In one or more embodiments, the first magnetic layer may have a fixed (or pinned) magnetization direction and the magnetization direction (or state) of the second magnetic layer having the Heusler compound may be configured to switch to be either aligned or anti-aligned with the magnetization direction of the first magnetic layer using spin transfer torque (STT). In this case, the MTJ is a bi-stable system in which the first magnetic layer functions as a reference layer and the second magnetic layer including the Heusler compound functions as the bit storage layer.

In one or more embodiments in which the second magnetic layer has a fixed (or pinned) magnetization direction, the method 300 may include an optional task 350 of forming a synthetic antiferromagnetic (SAF) layer above (e.g., on) the second magnetic layer. In one or more embodiments, the method 300 may include a task of forming a tantalum (Ta) layer or an iridium (Ir) layer between the second magnetic layer and the SAF layer. In one or more embodiment in which the first magnetic layer has a fixed (or pinned) magnetization direction and the magnetization direction (or state) of the second magnetic layer having the Heusler compound is configured to switch to be either aligned or anti-aligned with the magnetization direction of the first magnetic layer, the method 300 may not include the task 350 of forming the SAF layer.

In the illustrated embodiment, the method 300 also includes a task 355 of annealing the MTJ. The task 355 of annealing the MTJ is configured to increase the TMR of the MTJ. In one or more embodiments, the task 355 of annealing the MTJ may be performed in a vacuum. The thermal stability of the nitride seed layer is configured to prevent (or at least mitigate against) interdiffusion between the thermally stable nitride seed layer and the chemical templating layer during the task 355 of annealing the MTJ, which would otherwise result in deterioration of the PMA of the Heusler compound in the first magnetic layer. In one or more embodiments, the annealing task 355 may be performed directly or immediately after the task 330 of forming the magnetic layer including the Heusler compound.

In the illustrated embodiment, the method 300 also includes a task 360 of forming a cap layer above (e.g., on) the SAF layer formed in task 350 or, if the method 300 does not include the task 350 of forming the SAF layer, above (e.g., on) the second magnetic layer formed in task 345 to complete the magnetic memory device (e.g., the STT-MRAM).

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. A magnetic memory device comprising:

a substrate;

a thermally stable nitride seed layer above the substrate, the thermally stable nitride seed layer having a (001) crystal orientation;

a chemical templating layer above the thermally stable nitride seed layer, the chemical templating layer comprising a binary alloy having a CsCl prototype structure; and a magnetic layer above the chemical templating layer, the magnetic layer comprising a Heusler compound having perpendicular magnetic anisotropy (PMA).

2. The magnetic memory device of claim 1, wherein a composition of the thermally stable nitride seed layer is selected from the group consisting of ScN, TiN, AlN, VN, CrN, NbN, TaN, HfN, and ZrN.

3. The magnetic memory device of claim 2, wherein the thermally stable nitride seed layer has a thickness in a range from approximately 10 Å to approximately 200 Å.

4. The magnetic memory device of claim 1, wherein the thermally stable nitride seed layer comprises a first layer and a second layer above the first layer, the first layer comprising a material selected from the group consisting of ScN, TiN, AlN, VN, CrN, NbN, TaN, HfN, and ZrN, and a second layer comprising a different material selected from the group consisting of ScN, TiN, AlN, VN, CrN, NbN, TaN, HfN, and ZrN.

5. The magnetic memory device of claim 1, wherein the Heusler compound is $Mn_3Ge$.

6. The magnetic memory device of claim 1, wherein the magnetic layer has a thickness of less than approximately 5 nm.

7. The magnetic memory device of claim 1, wherein the binary alloy with the CsCl prototype structure is represented by $A_{1-x}E_x$, wherein A is a transition metal element and E is main group element.

8. The magnetic memory device of claim 7, wherein A is cobalt (Co), wherein E is aluminum (Al), and wherein x is in a range from 0.45 to 0.55.

9. The magnetic memory device of claim 1, further comprising a tunnel barrier layer above the magnetic layer.

10. The magnetic memory device of claim 9, wherein the tunnel barrier layer comprises MgO.

11. The magnetic memory device of claim 9, wherein tunnel barrier layer comprises $Mg_{1-z}Al_{2+(2/3)z}O_4$, wherein z is between −0.5 and 0.5.

12. The magnetic memory device of claim 11, wherein the tunnel barrier layer comprises $MgAl_2O_4$.

13. The magnetic memory device of claim 1, wherein the Heusler compound is selected from the group consisting of $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, and $Co_2MnSi$.

14. The magnetic memory device of claim 9, wherein the tunnel barrier layer is in contact with the magnetic layer.

15. The magnetic memory device of claim 9, further comprising a second magnetic layer above the tunnel barrier layer.

16. The magnetic memory device of claim 15, wherein the first magnetic layer comprising the Heusler compound is a free magnetic layer, and wherein the second magnetic layer is a pinned magnetic layer.

17. The magnetic memory device of claim 16, wherein the pinned magnetic layer comprises a synthetic antiferromagnet (SAF) layer.

18. The magnetic memory device of claim 15, wherein the first magnetic layer comprising the Heusler compound is a pinned magnetic layer, and wherein the second magnetic layer is a free magnetic layer.

19. The magnetic memory device of claim 15, further comprising a cap layer above the second magnetic layer.

20. A method of forming a magnetic memory device, the method comprising:

growing a thermally stable nitride seed layer substantially oriented in a (001) direction above a substrate;

growing a chemical templating layer above the thermally stable nitride seed layer, the chemical templating layer comprising a binary alloy having a CsCl prototype structure; and forming a magnetic tunnel junction above the chemical templating layer, the forming of the magnetic tunnel junction comprising:

forming a first magnetic layer above the chemical templating layer, the magnetic layer comprising a Heusler compound having perpendicular magnetic anisotropy;

forming a tunnel barrier layer above the first magnetic layer; and forming a second magnetic layer above the tunnel barrier; and annealing the magnetic tunnel junction, wherein a negative formation energy of the thermally stable nitride seed layer mitigates against interdiffusion of the thermally stable nitride seed layer into the chemical templating layer during the annealing.

21. The method of claim 20, wherein the thermally stable nitride seed layer has a thickness in a range from approximately 10 Å to approximately 200 Å.

22. The method of claim 20, wherein a composition of the thermally stable nitride seed layer is selected from the group consisting of ScN, TiN, AlN, VN, CrN, NbN, TaN, HfN, and ZrN.

* * * * *